United States Patent
Kim et al.

(10) Patent No.: US 7,501,327 B2
(45) Date of Patent: Mar. 10, 2009

(54) FABRICATING METHOD OF SEMICONDUCTOR OPTICAL DEVICE FOR FLIP-CHIP BONDING

(75) Inventors: Young-Hyun Kim, Suwon-si (KR); In Kim, Suwon-si (KR); Yu-Dong Bae, Suwon-si (KR); Young-Churl Bang, Suwon-si (KR)

(73) Assignee: Samsung Electronics Co., Ltd., Yeongtong-Gu, Suwon-Si, Gyeonggi-Do (KR)

( * ) Notice: Subject to any disclaimer, the term of this patent is extended or adjusted under 35 U.S.C. 154(b) by 225 days.

(21) Appl. No.: 11/217,015

(22) Filed: Aug. 31, 2005

(65) Prior Publication Data

US 2006/0094142 A1 May 4, 2006

(30) Foreign Application Priority Data

Nov. 3, 2004 (KR) ............... 10-2004-0089031

(51) Int. Cl.
*H01L 21/76* (2006.01)
(52) U.S. Cl. ............... 438/403; 438/46; 438/975; 257/E23.179; 372/45
(58) Field of Classification Search ............... 438/31, 438/22, 26, 29, 46, 39–44, 401, 402, 403, 438/942, 975, 106; 257/194, 466, 797, 94, 257/E23.179; 372/45.01, 45, 46.01
See application file for complete search history.

(56) References Cited

U.S. PATENT DOCUMENTS

| | | | | |
|---|---|---|---|---|
| 5,610,095 A * | 3/1997 | Zirngibl | ............... | 438/23 |
| 6,593,162 B1 * | 7/2003 | Park et al. | ............... | 438/31 |
| 6,661,822 B1 * | 12/2003 | Kubota et al. | ............... | 372/46.01 |
| 6,911,713 B2 * | 6/2005 | Ikeda et al. | ............... | 257/466 |
| 7,095,057 B2 * | 8/2006 | Song et al. | ............... | 257/94 |
| 2001/0012306 A1 * | 8/2001 | Yamazaki | ............... | 372/43 |
| 2002/0001326 A1 * | 1/2002 | Chino | ............... | 372/45 |
| 2002/0043209 A1 * | 4/2002 | Arakawa et al. | ............... | 117/95 |
| 2003/0008426 A1 * | 1/2003 | Kise et al. | ............... | 438/22 |
| 2004/0124424 A1 * | 7/2004 | Tatsumi | ............... | 257/79 |
| 2005/0271103 A1 * | 12/2005 | Otsubo | ............... | 372/43.01 |
| 2006/0017064 A1 * | 1/2006 | Saxler et al. | ............... | 257/194 |
| 2007/0134828 A1 * | 6/2007 | Narita | ............... | 438/22 |

* cited by examiner

*Primary Examiner*—Zandra V. Smith
*Assistant Examiner*—Latanya Crawford
(74) *Attorney, Agent, or Firm*—Cha & Reiter, LLC

(57) ABSTRACT

Disclosed is a method for manufacturing a semiconductor optical device for flip-chip bonding. The method includes the steps of: etching an active layer and clad which are sequentially stacked on a semiconductor substrate into first and second alignment keys and an optical area, which has a mesa structure; growing at least two insulating layers at mesa-etched portions between the first and second alignment keys and the optical areas; and forming protection masks on the first and second alignment keys, growing an electrode on the optical area and the insulating layer except for the protection masks, and removing the protection masks.

8 Claims, 4 Drawing Sheets

FABRICATING METHOD OF SEMICONDUCTOR OPTICAL DEVICE FOR FLIP-CHIP BONDING

CLAIM OF PRIORITY

This application claims priority to an application entitled "Fabricating method of semiconductor optical device for flip-chip bonding," filed in the Korean Intellectual Property Office on Nov. 3, 2004 and assigned Serial No. 2004-89031, the contents of which are hereby incorporated by reference.

BACKGROUND OF THE INVENTION

1. Field of the Invention

The present invention relates to a method for manufacturing a semiconductor and, more particularly, to a method of manufacturing a semiconductor optical device having at least one optical axis alignment key.

2. Description of the Related Art

Semiconductor optical devices include a light source for generating light and a light-receiving device for receiving the light. A semiconductor laser is typically used as the semiconductor light source and includes an optical device that is aligned with a planar lightwave circuit (PLC). A passive alignment method and an active alignment method are mainly used in order to align the optical axes of the semiconductor optical device and the PLC.

According to the active alignment method, optical axes are aligned based on a comparison between the amount of the light generated in a semiconductor laser requiring the optical axis alignment and the amount of the light transmitted through the PLC. The active alignment method delivers a precise optical axis alignment, but requires a relatively longer processing time, which is not suitable for the mass-production thereof.

According to the passive alignment method, predetermined types of alignment keys are marked at the optical axis alignment position of a semiconductor laser and PLC. The passive alignment method is considered easier to align optical axes.

FIG. 1 is a cross-sectional view showing a conventional semiconductor optical device. As shown, the semiconductor optical device 100 includes a semiconductor substrate 110, active layers 120a and 120b, clads 121a and 121b having multi-layered well-shaped structures (formed through etching on the semiconductor 110 to yield a mesa structure), current insulating layers 130 and 140, an electrode 150, and first and second alignment keys 170 and 160.

The active layers 120a and 120b and the clads 121a and 121b are grown sequentially on the semiconductor substrate 110 and then etched to have a mesa structure. To achieve this, a mask (not shown) is positioned above the clads 121a and 121b. Then, the clads 121a and 121b are mesa-etched into a first alignment key 170 and an optical area 180 according to alignment patterns (not shown) formed in the mask and optical patterns (not shown). The optical area 180 performs optical functions of receiving and emitting light.

The first alignment key 170 serves as a reference for forming the second alignment keys 160, and the second alignment key 160 is spaced apart from the first alignment key 170 by a predetermined distance.

The current insulating layers 130 and 140 are formed at a location at which at least two semiconductor layers are mesa-etched. Further, the current insulating layers 130 and 140 may be formed by sequentially stacking a p-type semiconductor layer and an n-type semiconductor layer. After the current insulating layers 130 and 140 are grown, the optical device is flattened.

The electrode 150 is formed on the insulating layers 130 and 140, the first alignment key 170, and the optical area 180. The electrode 150 transfers current for driving the optical area 180.

The second alignment keys 160 are formed on the electrode using the first alignment key 170 as a guide. As such, the second alignment keys 160 are used to align the optical axis of the semiconductor optical device 100 with the optical axis of an optical device, such as a PLC. The optical axis alignment method using the second alignment keys 160 is referred to as a passive alignment method or a flip-chip bonding method. Thus, the second alignment keys 160 are called flip-chip bonding keys and may be made of a metal thin film or dielectric materials.

FIG. 2 is a photograph showing a portion of a semiconductor optical device manufactured according to the prior art as described above. An allowance for error in a general optical axis alignment is ±1 μm.

However, the border of the first alignment key becomes imprecise, as shown in FIG. 2, when undergoing a flattening and re-growing process of the semiconductor layer. Accordingly, when forming the second alignment key, the border of the first alignment key may cause the second alignment key to have an alignment error beyond the allowance. As a result, the optical axis alignment process is affected.

SUMMARY OF THE INVENTION

Accordingly, the present invention has been made to solve the above-mentioned problems occurring in the prior art and provides additional advantages, by providing a method for manufacturing a semiconductor optical device for flip-chip bonding which can easily perform a passive alignment and minimize the alignment error.

In one embodiment, there is provided a method for manufacturing a semiconductor optical device for flip-chip bonding which includes the steps of: etching an active layer and clad which are sequentially stacked on a semiconductor substrate into first, second alignment keys and an optical area having a mesa structure; growing at least two current insulating layers at mesa-etched portions between the first, second alignment keys and the optical areas; and forming protection masks on the first and second alignment keys, growing an electrode on the optical area and the current insulating layer except for the protection masks, and removing the protection masks.

BRIEF DESCRIPTION OF THE DRAWINGS

The above features and advantages of the present invention will be more apparent from the following detailed description taken in conjunction with the accompanying drawings, in which.

DETAILED DESCRIPTION

Figure 1:
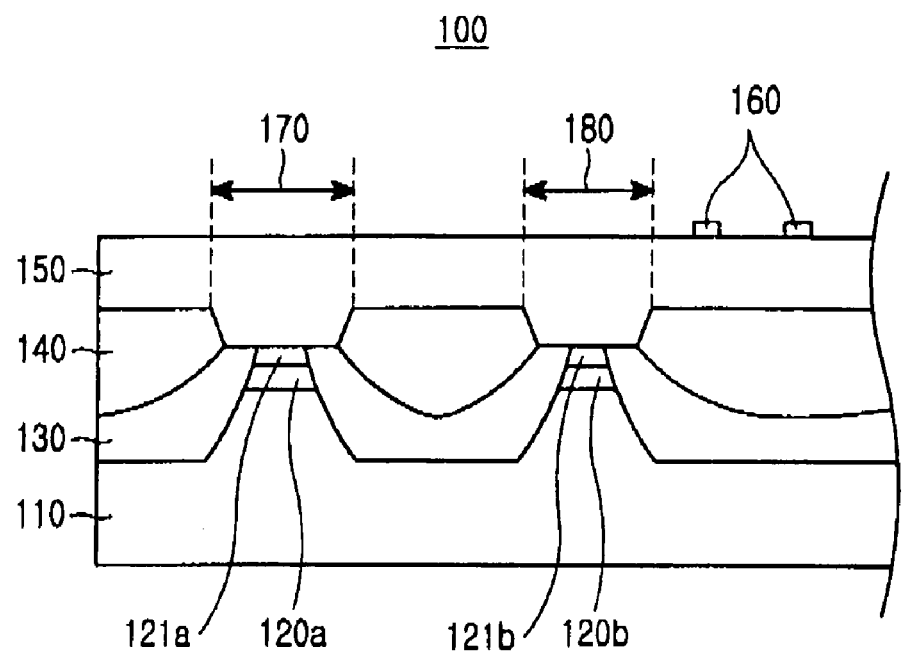
FIG. 1 is a cross-sectional view of a conventional semiconductor optical device.
Figure 2:
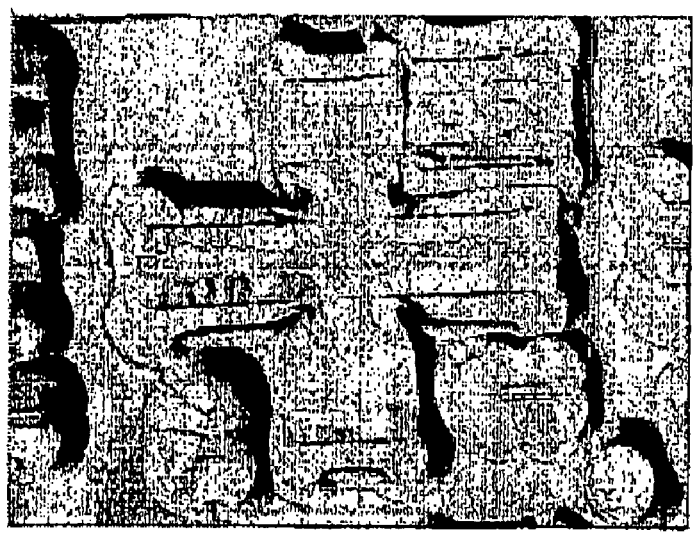
FIG. 2 is a photograph for showing a portion of a semiconductor optical device manufactured according to a prior art.
Figure 3A:
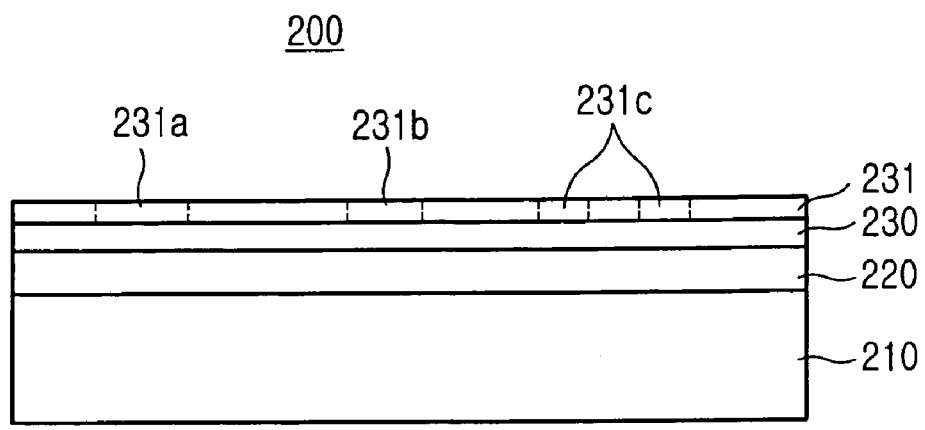
FIGS. 3a to 3e illustrate the manufacturing sequence of a semiconductor optical device according to an embodiment of the present invention.
Figure 3B:
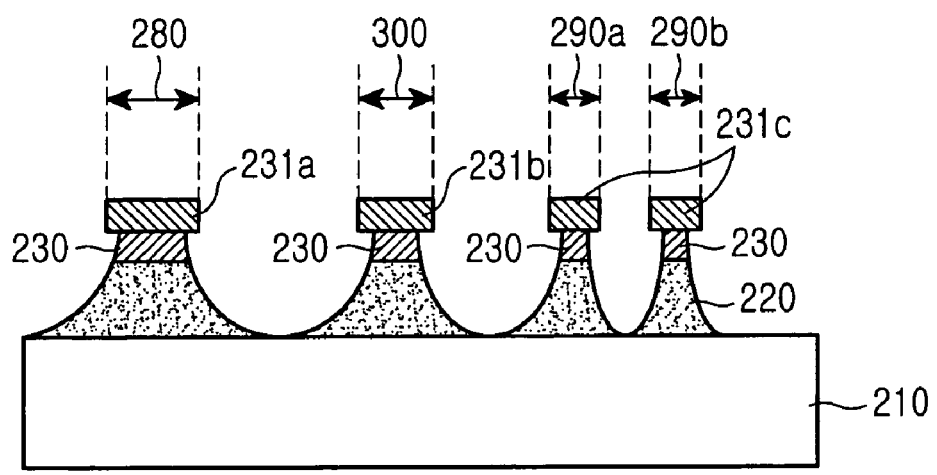
Figure 3C:
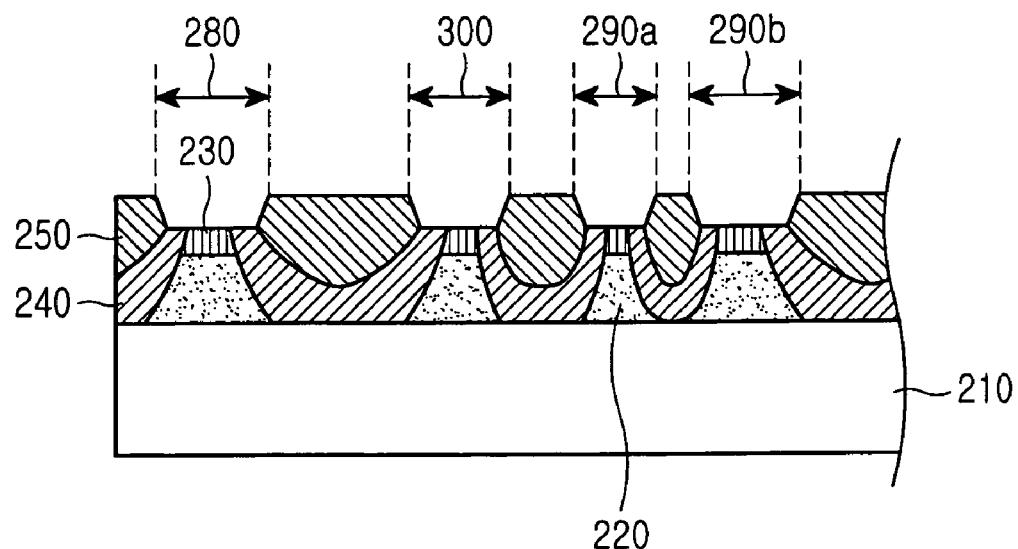
Figure 3D:
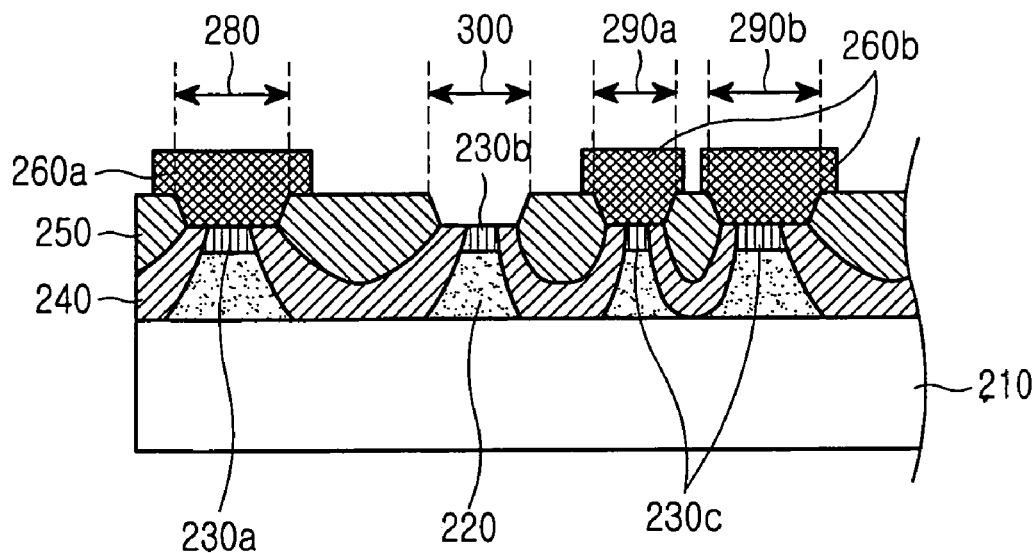
Figure 3E:
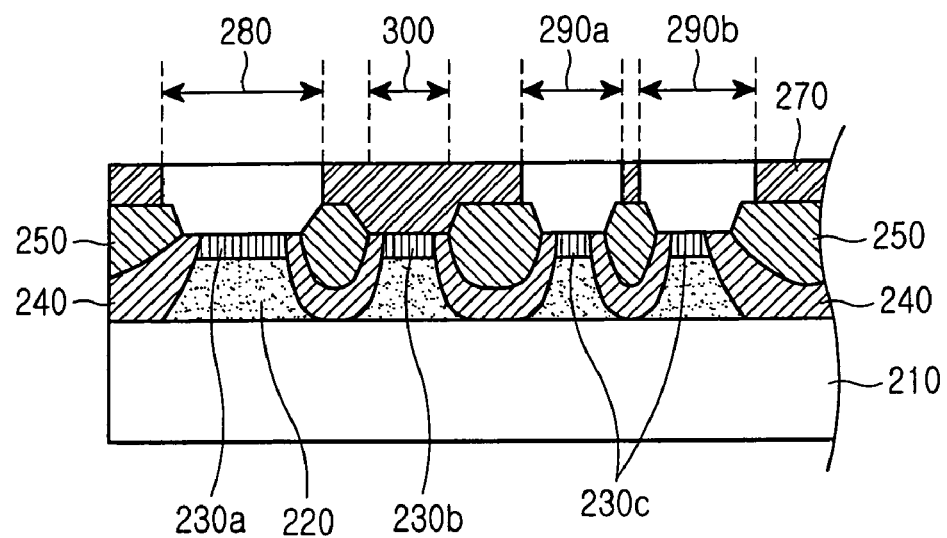

Hereinafter, embodiments of the present invention will be described with reference to the accompanying drawings. For the purposes of clarity and simplicity, a detailed description of known functions and configurations incorporated herein will be omitted as it may make the subject matter of the present invention unclear.

Referring to FIGS. 3a to 3e, a method of manufacturing a semiconductor optical device for flip-chip bonding according to the present invention briefly includes an etching process in which an active layer 220 and a clad 230 stacked on a semiconductor substrate 210 in sequence are etched to form a mesa structure, a growing process in which current insulating layers 240 and 250 are grown at a mesa-etched portion between the active layer 220 and the clad 230, and an electrode forming process of forming an electrode 270.

The etching process comprises a growing step and an etching step, mesa-etching the active layer 220 and the clad 230 according to alignment patterns 231a and 231c and an optical pattern 231b of a mask 231. After the active layer 220 and the clad 230 are mesa-etched, the residual mask 231 is removed. The growing step involves sequentially growing the active layer 220, the clad 230, and the mask 231 on the semiconductor substrate 210. The mask 231 can be made of a $SiO_2$ film, and the active layer 220 has a multiple well structure grown by a metal-organic chemical vapor deposition (MOCVD) method. Alignment patterns 231a and 231c for generating the first and second alignment keys 280, 290a, and 290b are formed on the grown mask 231, and an optical pattern 231b is formed at a portion to be etched with an optical area 300.

The growing process is a process in which the current insulating layers 240 and 250 are grown at a mesa-etched portion between the active layer 220 and the clad 230. The current insulating layers 240 and 250 can be a structure in which a p-type semiconductor layer and an n-type semiconductor layer are sequentially stacked. The current insulating layers 240 and 250 are grown by the method of MOCVD, etc. An N-InP substrate can be used as the semiconductor substrate 210.

The electrode forming process is a process in which the electrode 270 for generating light or supplying the current to the optical area 300 for receiving light is formed. Note that if the optical area 300 generates light, the semiconductor optical device 200 can be used as a light source. Also, the optical area 300 can be used as a light-receiving device.

In the electrode forming process, protection masks 260a and 260c for protecting the first and second alignment keys 280, 290a, and 290b are formed on the first and second alignment keys 280, 290a, and 290b prior to the formation of the electrode 270. The electrode 270 is grown on the optical area 300 except for a portion in which the protection masks 260a and 260c are formed, and the current insulating layers 240 and 250 by MOCVD, etc. After the electrode 270 is formed, the protection masks 260a and 260c are removed.

Figure 4:
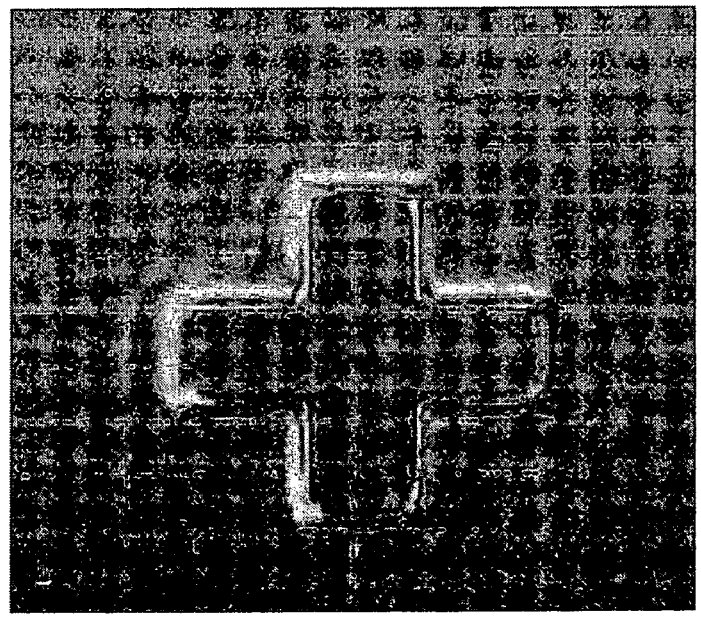
FIG. 4 is a photograph for showing a portion of a semiconductor optical device manufactured according to the present invention.

FIG. 4 is a photograph for showing a portion of the semiconductor optical device manufactured according to the present invention. As the first and second alignment keys 280, 290a, and 290b which constitute the semiconductor optical device according to the present invention are formed simultaneously with mesa-etching of the active layer 220, they are spaced apart by constant intervals. Furthermore, since the protection masks 260a and 260b can be formed on the first and second alignment keys 280, 290a, and 290b before the current insulating layers 240 and 250 and the electrode 270 are formed, the borders of the alignment keys 280, 290a, and 290b are prevented from becoming imprecise even after being re-grown. Accordingly, the second alignment keys 290a and 290b are used to produce a more accurate result in the optical axis alignment of the semiconductor optical device to a PLC, etc., by a passive optical axis alignment such as the flip-chip bonding.

In a fabricating method according to the present invention, the alignment keys are formed simultaneously with the mesa-etching of the optical area, and the protection masks larger than corresponding alignment masks are formed before a re-growing process is progressed. This permits preventing the border portions of the alignment keys from becoming wider due to re-growing as in the prior art.

While the invention has been shown and described with reference to certain preferred embodiments thereof, it will be understood by those skilled in the art that various changes in the form and details may be made therein without departing from the spirit and scope of the invention as defined by the appended claims.

What is claimed is:

1. A method for manufacturing a semiconductor optical device for flip-chip bonding, the method includes the steps of:
    etching an active layer and clad that are stacked on a semiconductor substrate in sequence into a first alignment key, a second alignment key and an optical area, said etching being determined by patterns in said clad, some of said patterns being deemed as alignment patterns;
    removing said alignment patterns after said etching is completed;
    growing at least two insulating layers at the etched portions between the first and second alignment keys and the optical areas;
    forming protection masks on the first and second alignment keys, said protection masks covering said alignment keys and extending onto select portions of said at least two insulating layers;
    forming an electrode on the optical area and the insulating layers; and
    removing said protection masks after said electrode is formed.

2. The method according to claim 1, wherein the protection masks are substantially larger than the first and second alignment keys.

3. The method according to claim 1, wherein the protection masks are substantially larger than the second alignment keys.

4. The method according to claim 1, wherein the semiconductor optical device comprises a semiconductor laser.

5. The method according to claim 1, wherein the protection masks comprise a $SiO_2$ film.

6. The method according to claim 1, wherein the insulating layers comprises a p-type semiconductor layer and an n-type semiconductor layer.

7. The method according to claim 1, wherein the insulating layers are grown by using a metal-organic chemical vapor deposition (MOCVD) method.

8. The method according to claim 1, wherein the semiconductor substrate comprises an N-InP substrate.

* * * * *